(12) United States Patent
Erickson et al.

(10) Patent No.: US 8,456,187 B2
(45) Date of Patent: Jun. 4, 2013

(54) IMPLEMENTING TEMPORARY DISABLE FUNCTION OF PROTECTED CIRCUITRY BY MODULATING THRESHOLD VOLTAGE OF TIMING SENSITIVE CIRCUIT

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/091,243

(22) Filed: Apr. 21, 2011

(65) Prior Publication Data
US 2012/0268160 A1    Oct. 25, 2012

(51) Int. Cl.
*H03K 19/00* (2006.01)
(52) U.S. Cl.
USPC .................................................. 326/8
(58) Field of Classification Search
USPC .................................................. 326/8
See application file for complete search history.

(56) References Cited

U.S. PATENT DOCUMENTS

| 6,087,690 | A  | 7/2000  | Chi |
| 6,260,172 | B1 | 7/2001  | Hazama |
| 6,330,648 | B1 | 12/2001 | Wambach et al. |
| 6,438,059 | B2 | 8/2002  | Akita et al. |
| 6,821,857 | B1 | 11/2004 | Khan et al. |
| 7,080,001 | B2 | 7/2006  | Moriyama et al. |
| 7,115,950 | B2 | 10/2006 | Tokushige |
| 7,208,798 | B2 * | 4/2007 | Baba .......................... 257/347 |
| 7,394,708 | B1 | 7/2008  | Vadi |
| 7,479,418 | B2 | 1/2009  | Cai et al. |
| 7,514,766 | B2 | 4/2009  | Yoshida |

(Continued)

FOREIGN PATENT DOCUMENTS

JP    2004207749    7/2004

OTHER PUBLICATIONS

"SOI-DRAM circuit technologies for low power high speed multigiga scale memories" bt Kuge, S.; Morishita, F.; Tsuruda, T.; Tomishima, S.; Tsukude, M.; Yamagata, T.; Arimoto, K.;Solid-State Circuits, IEEE Journal vol. 31, Issue: 4, Publication Year: 1996, pp. 586-591 Digital Object Identifier: 10.1109/4.499736.

(Continued)

*Primary Examiner* — Thienvu Tran
(74) *Attorney, Agent, or Firm* — Joan Pennington

(57) ABSTRACT

A method and circuits for implementing a temporary disable function at indeterminate times of circuitry to be protected in a semiconductor chip, such as in an integrated circuit or a system on a chip (SOC) by modulating threshold voltage shifts of a timing sensitive circuit, and a design structure on which the subject circuit resides are provided. The timing sensitive circuit is designed to be sensitive to threshold-voltage shifts and is placed over an independently voltage controlled silicon region. Upon startup, the independently voltage controlled silicon region is grounded, and then is left floating. Each time a hack attempt or predefined functional oddity is detected, charge is applied onto the independently voltage controlled silicon region. After a defined charge has accumulated, the device threshold voltages in the timing sensitive circuit above the independently voltage controlled silicon region are modulated causing the timing-sensitive circuit to fail.

23 Claims, 6 Drawing Sheets

U.S. PATENT DOCUMENTS

| | | | |
|---|---|---|---|
| 7,535,744 B2 * | 5/2009 | Okuda | 365/112 |
| 7,551,019 B2 | 6/2009 | Fujita et al. | |
| 7,573,317 B2 | 8/2009 | Lewis et al. | |
| 7,629,233 B2 | 12/2009 | Bernstein et al. | |
| 7,675,317 B2 | 3/2010 | Perisetty | |
| 7,687,365 B2 | 3/2010 | Sleight | |
| 7,795,044 B2 | 9/2010 | Wickramasinghe et al. | |
| 2001/0026990 A1 | 10/2001 | Christensen et al. | |
| 2006/0234428 A1 | 10/2006 | Furukawa et al. | |
| 2007/0189051 A1 * | 8/2007 | Okuda | 365/64 |
| 2009/0108314 A1 | 4/2009 | Cai et al. | |
| 2009/0204777 A1 * | 8/2009 | Norman | 711/163 |
| 2009/0236683 A1 * | 9/2009 | Williams et al. | 257/510 |
| 2010/0067319 A1 | 3/2010 | Aipperspach et al. | |
| 2010/0133607 A1 | 6/2010 | Mouli | |
| 2010/0189262 A1 | 7/2010 | Ducharme et al. | |
| 2011/0018094 A1 | 1/2011 | Chapman et al. | |
| 2011/0122694 A1 * | 5/2011 | Modave et al. | 365/185.04 |

OTHER PUBLICATIONS

"Optimal body bias selection for leakage improvement and process compensation over different technology generations" by Cassondra Neau, Kaushik Roy ISLPED '03: Proceedings of the 2003 international symposium on Low power electronics and design; Aug. 2003, pp. 116-121 ACM 1-58113-682-X/03/0008.

"Implementing eFUSE Circuit With Enhanced eFUSE Blow Operation" by Karl R. Erickson et al., U.S. Appl. No. 13/091,259, filed on the same day herewith.

An Independently Voltage Controlled Volume of Silicon on a Silicon on Insulator Chip: by Karl R. Erickson et al., U.S. Appl. No. 13/091,275, filed on the same day herewith.

"eDRAM Having Dynamic Retention and Performance Tradeoff" by Karl R. Erickson et al., U.S. Appl. No. 13/091,292, filed on the same day herewith.

* cited by examiner

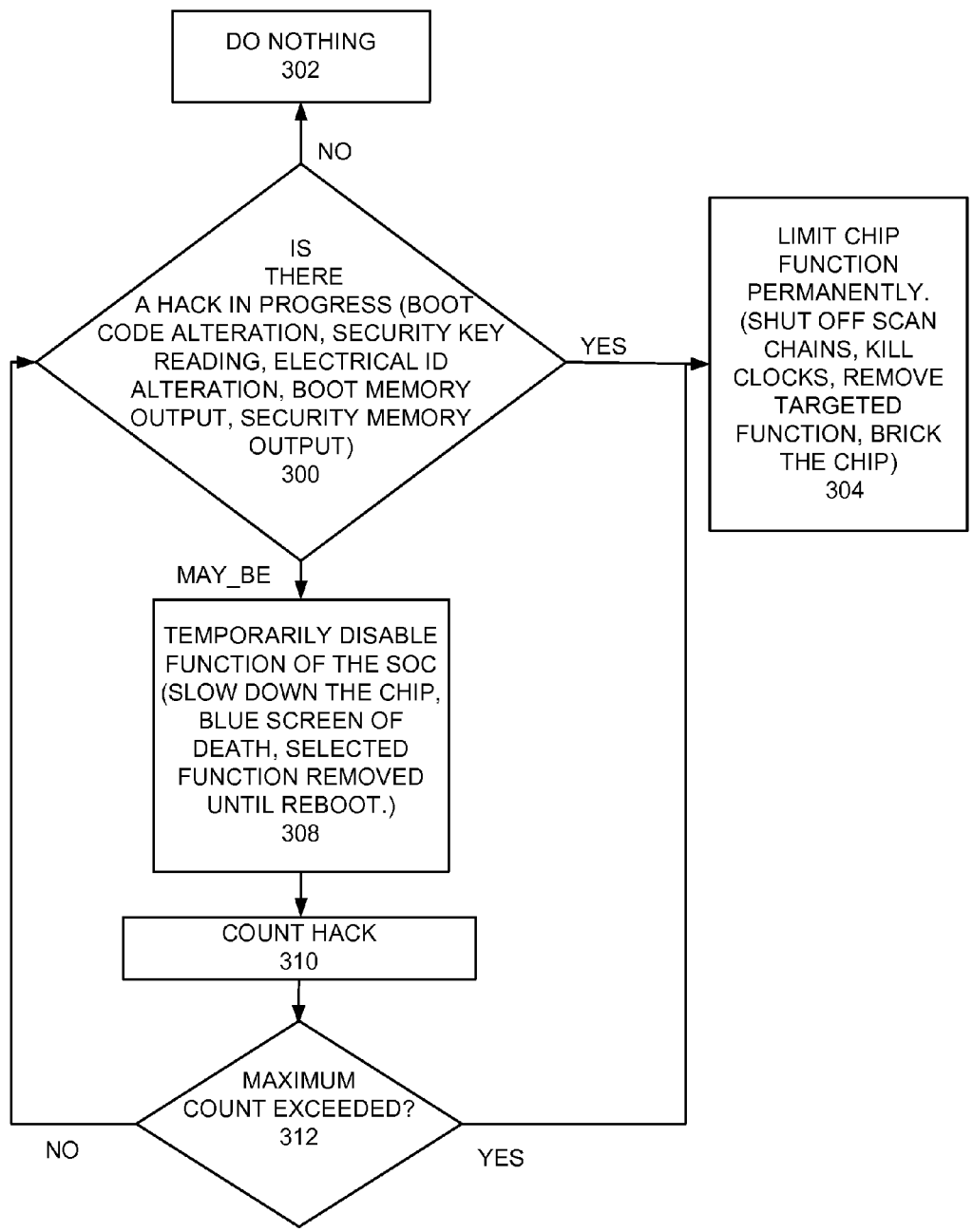

IMPLEMENTING TEMPORARY DISABLE FUNCTION OF PROTECTED CIRCUITRY BY MODULATING THRESHOLD VOLTAGE OF TIMING SENSITIVE CIRCUIT

FIELD OF THE INVENTION

The present invention relates generally to the data processing field, and more particularly, relates to a method and circuits for implementing a temporary disable function of circuitry to be protected, such as in an integrated circuit or a system on a chip (SOC), by modulating threshold voltage of a timing sensitive circuit, for example, responsive to a hacking detection function, and a design structure on which the subject circuit resides.

DESCRIPTION OF THE RELATED ART

A need exists for an effective arrangement for implementing a temporary disable function of circuitry to be protected, such as in an integrated circuit or a system on a chip (SOC), for example, responsive to a hacking detection function. Hacking detection is extremely important to secure hardware from unauthorized access but has many significant practical limitations. Typically the reaction to detected hacking is to destroy the hardware, for example, causing the hardware chip to permanently lock-up, also called bricking the chip. This means the hacking detection circuit must be created such that it will only trip if the designers are certain a hacking attempt is happening. This limits what the hacking detection circuit can trip on.

For an example a hacker would increment through an instruction space in order to figure out how a system on a chip (SOC) works. This can cause invalid instructions to be sent to the CPU. Getting one invalid instruction is not sufficient to cause a SOC shutdown but an invalid instruction indicates a known hacking technique.

Another hacking detection issue is the continuous reading or scanning of boot or other instruction storage memories in order to determine when certain instructions are executed. Some hacks allow the system to run a standard boot but then will stop the boot process before the full security system can be initialized. Of course normal function can not be flagged as a hacking attempt but this leaves a large functional area that can not be effectively monitored for hacking.

Because the chip is disabled during the hack attempt the hacker can identify what tripped the detection circuit and avoid that function in the future. This allows a trial-and-error approach to hacking a high volume commercially available electronics part, such as game consoles and cells phones. For example, with high volume parts hackers are looking for an exploit that can be used to change the intended function of the chip.

A need exists for an enhanced mechanism for efficiently and effectively implementing a temporary disable function of circuitry to be protected, particularly for effectively protecting the circuitry from hacking or unauthorized access.

SUMMARY OF THE INVENTION

Principal aspects of the present invention are to provide a method and circuits for implementing a temporary disable function of circuitry to be protected, and a design structure on which the subject circuit resides. Other important aspects of the present invention are to provide such method, circuits and design structure substantially without negative effects and that overcome many of the disadvantages of prior art arrangements.

In brief, a method and circuits for implementing a temporary disable function of circuitry to be protected, such as in an integrated circuit or a system on a chip (SOC) by modulating threshold voltage shifts of a timing sensitive circuit of the circuitry to be protected, and a design structure on which the subject circuit resides are provided. The timing sensitive circuit is designed to be sensitive to threshold-voltage shifts and is placed over an independently voltage controlled silicon region. Upon startup, the independently voltage controlled silicon region is grounded, and then is left floating. Each time a hack attempt or predefined functional oddity is detected, charge is applied onto the independently voltage controlled silicon region. After a defined charge has accumulated, the threshold voltages of the devices in the silicon above the independently voltage controlled silicon region are modulated causing the timing-sensitive circuit to fail.

In accordance with features of the invention, the independently voltage controlled silicon region is an isolated substrate region. The independently voltage controlled silicon region is created as a circuit element. Sides of the independently voltage controlled silicon region are formed with deep trench isolation, thereby insulating the independently voltage controlled silicon region on all sides. A bottom of the independently voltage controlled silicon region is created with a deep implant such as boron to create an N region when the substrate is doped P-. A buried oxide (BOX) region forms a top surface of the independently voltage controlled silicon region, thereby completing electrical isolation of the independently voltage controlled silicon region. An electrical contact for connecting the independently voltage controlled silicon region to the startup grounding signal and the hack detect charging signal, for example, is formed through the deep implant and the silicon substrate below the independently voltage controlled silicon region.

In accordance with features of the invention, the circuit includes hacking detection circuitry including, for example, an antenna wrapped around a dynamic bus inside circuitry to be protected. The antenna together with the dynamic bus node is designed so an average bus access activates a field effect transistor (FET) that is connected to a capacitor. The FET drains the capacitor in a specified number of activations by the antenna. The capacitor has a leakage path to a voltage supply rail VDD that charges the capacitor back high after a time, such as ten to one hundred cycles, of the dynamic bus being quiet. The capacitor provides a hacking detect signal for temporarily blocking operation of the circuitry to be protected responsive to determining that the dynamic bus is more active than functionally expected.

In accordance with features of the invention, the circuitry to be protected includes an integrated circuit chip, such as a system on a chip (SOC). The hacking detection circuit detects hacking attacks, such as, a boot ROM being accessed several times or a security array being cycled through its entire address space.

In accordance with features of the invention, the hacking detect signal is used to temporarily deactivate circuitry to be protected, for example, until the SOC is rebooted.

In accordance with features of the invention, the independently voltage controlled silicon region includes an electrically isolated region of conductive substrate providing a noiseless, isolated substrate below the timing sensitive circuit of the circuitry to be protected.

In accordance with features of the invention, the independently voltage controlled silicon region includes a variable leakage to ground, for example, dependant upon process variation and environmental conditions providing an intermittent or indeterminate fail point for the timing sensitive circuit of the circuitry to be protected.

In accordance with features of the invention, the independently voltage controlled silicon region includes a variable capacitance, for example, dependant upon process variation and environmental conditions, providing an intermittent or indeterminate fail point for the timing sensitive circuit of the circuitry to be protected.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 is a functional flow diagram illustrating an example hacking detection and blocking function for implementing hacking detection and blocking in accordance with a preferred embodiment.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing a temporary disable function of circuitry to be protected responsive to hacking detection, and a design structure on which the subject circuit resides are provided.

Figure 1:
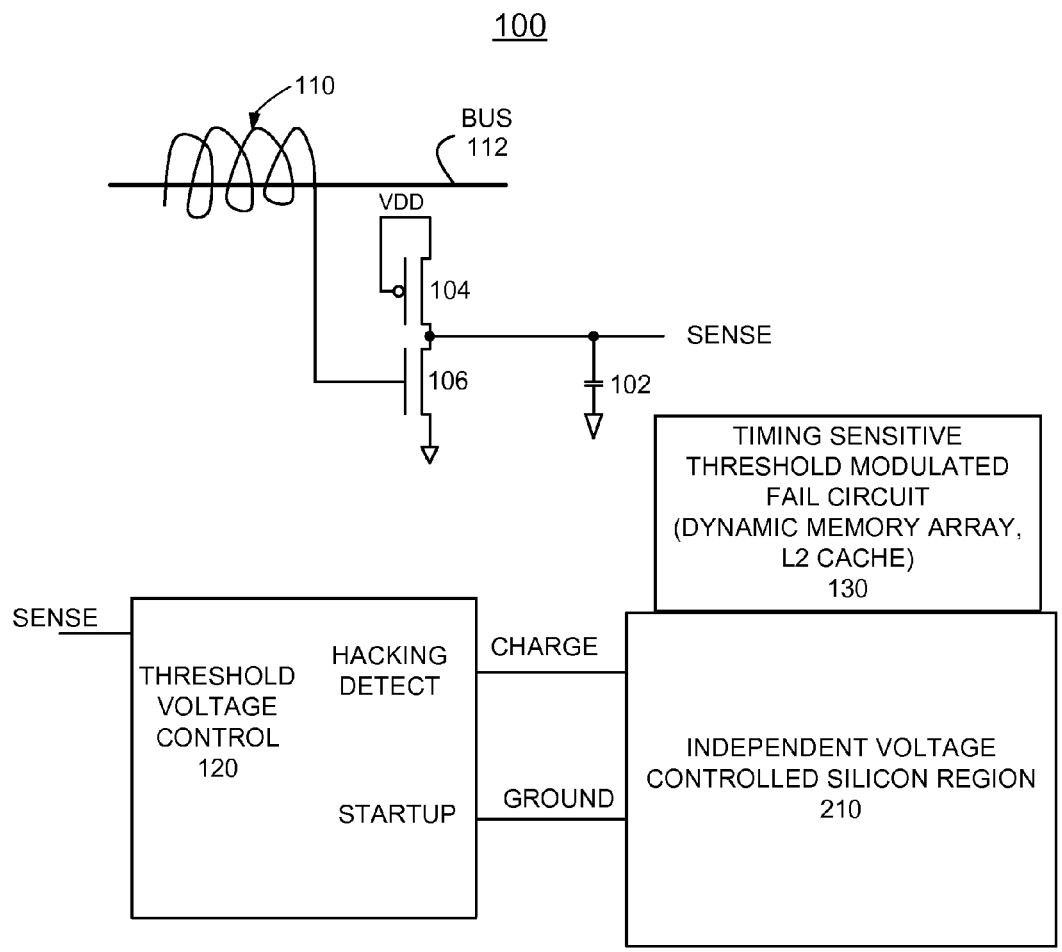
FIG. 1 is a schematic diagram representation illustrating an example hacking detection and temporary disable circuit implementing a temporary disable function for circuitry to be protected including an integrated circuit chip, such as a system on a chip (SOC), responsive to hacking detection in accordance with a preferred embodiment.

Having reference now to the drawings, in FIG. 1, there is shown an example hacking detection and temporary disable circuit implementing a temporary disable function by modulating threshold voltage shifts of a timing sensitive circuit of circuitry to be protected including an integrated circuit chip, such as a system on a chip (SOC), responsive to hacking detection generally designated by the reference character 100 in accordance with a preferred embodiment.

The hacking detection and temporary disable circuit 100 includes a capacitor 102 connected between ground and a node SENSE connected to a junction connection of a P-channel field effect transistor (PFET) 104 and an N-channel field effect transistor (NFET) 106. PFET 104 and NFET 106 are series connected between a voltage supply rail VDD and ground. An antenna generally designated by the reference character 110 is wrapped around a dynamic bus 112 inside circuitry to be protected and connected to a gate input of the NFET 106.

The circuitry to be protected includes an integrated circuit chip, such as a system on a chip (SOC). The hacking detection and temporary disable circuit 100 detects hacking attacks, such as, a boot ROM being accessed several times or a security array being cycled through its entire address space. The capacitor 102 provides a hacking detect signal SENSE used to activate a temporary disable function for temporarily deactivating circuitry to be protected responsive to determining that the dynamic bus 112 is more active than functionally expected.

The antenna 110 together with the dynamic bus 112 is designed so that an average bus access activates the N-channel field effect transistor (NFET) 106 that is connected to the capacitor 102. In operation of the hacking detection circuit 100, NFET 106 drains the capacitor 102 in a specified number of activations by the antenna 110. The capacitor 102 has a leakage path via PFET 104 to the voltage supply rail VDD that charges the capacitor 102 back high after a time, such as ten to one hundred cycles, of the dynamic bus 112 being quiet. The PFET 104 and NFET 106 are appropriately sized to provide the leakage path via PFET 104 to the voltage supply rail VDD for charging the capacitor 102 during such quiet time of dynamic bus 112.

Once this capacitor 102 drops to a predetermined voltage, the hacking detect signal SENSE is used to temporarily deactivate circuitry to be protected, and is applied to a threshold voltage control function 120. An independent voltage controlled silicon region 210 connected to the threshold voltage control function 120 receives a ground potential input at startup, and receives a charge input responsive to the hacking detect, responsive to the hacking detect signal SENSE. The threshold voltage control function 120 is a simple circuit including, for example, a driver transistor (not shown) such as a P-channel field effect transistor (PFET) transferring charge to the substrate silicon region 210 responsive to the hacking detect signal SENSE.

In accordance with features of the invention, the independent voltage controlled silicon region 210 is an electrically isolated island of conductive substrate. This isolation of region 210 provides a noiseless, isolated substrate for a timing-sensitive circuit 130.

In accordance with features of the invention, the hacking detection and temporary disable circuit 100 implements a temporary disable function of circuitry to be protected, by modulating device threshold voltage shifts of the timing sensitive circuit 130 of the circuitry to be protected. The timing sensitive circuit 130 is designed to be sensitive to threshold-voltage shifts and is placed over the independently voltage controlled silicon region 210.

The independent voltage controlled silicon region 210 efficiently and effectively modulates threshold voltage shifts of a timing sensitive circuit 130 of the circuitry to be protected. The timing sensitive circuit 130 includes a dynamic memory array, such as an L2 cache of the circuitry to be protected. After enough substrate charge has accumulated in the independent voltage controlled silicon region 210, the threshold voltages of the devices of timing-sensitive circuit 130 in the silicon above the substrate silicon region 210 will modulate far enough to make the timing-sensitive circuit 130 fail.

Every time the threshold voltage control function 120 activates, charge is transferred to the substrate silicon region 210. While there is some leakage to ground when the substrate silicon region 210 is charged responsive to several detected hacking attempts over a short period of time, the timing-sensitive circuit 130 above the substrate silicon region 210 will slow down enough to fail. An intermittent fail point will differ across process variation and environmental conditions making it very difficult to determine what caused the fail. The hacking detection and temporary disable circuit 100 implements a temporary shut down circuit with minimal valuable silicon real estate.

Upon startup, the independently voltage controlled silicon region 210 is grounded by the threshold voltage control function 120, and then is left floating. Each time a hack attempt or a predefined functional oddity is detected, charge is applied onto the independently voltage controlled silicon region 210 by the threshold voltage control function 120. After enough charge has accumulated, the threshold voltages of the devices of the timing sensitive circuit 130 formed in the silicon above the independently voltage controlled silicon region 210 are modulated causing the timing-sensitive circuit to fail.

For example, both the capacitor discharging operation of the capacitor 102 and the charging of onto the independently voltage controlled silicon region 210 by the threshold voltage control function 120 causes the deactivation or fail point for each chip to vary, thus obfuscating what actually causes the fail. Additionally, since this fail is temporary the chip designers can use this technique to monitor chip functions that are not definite hacking fail points.

Figure 2A:
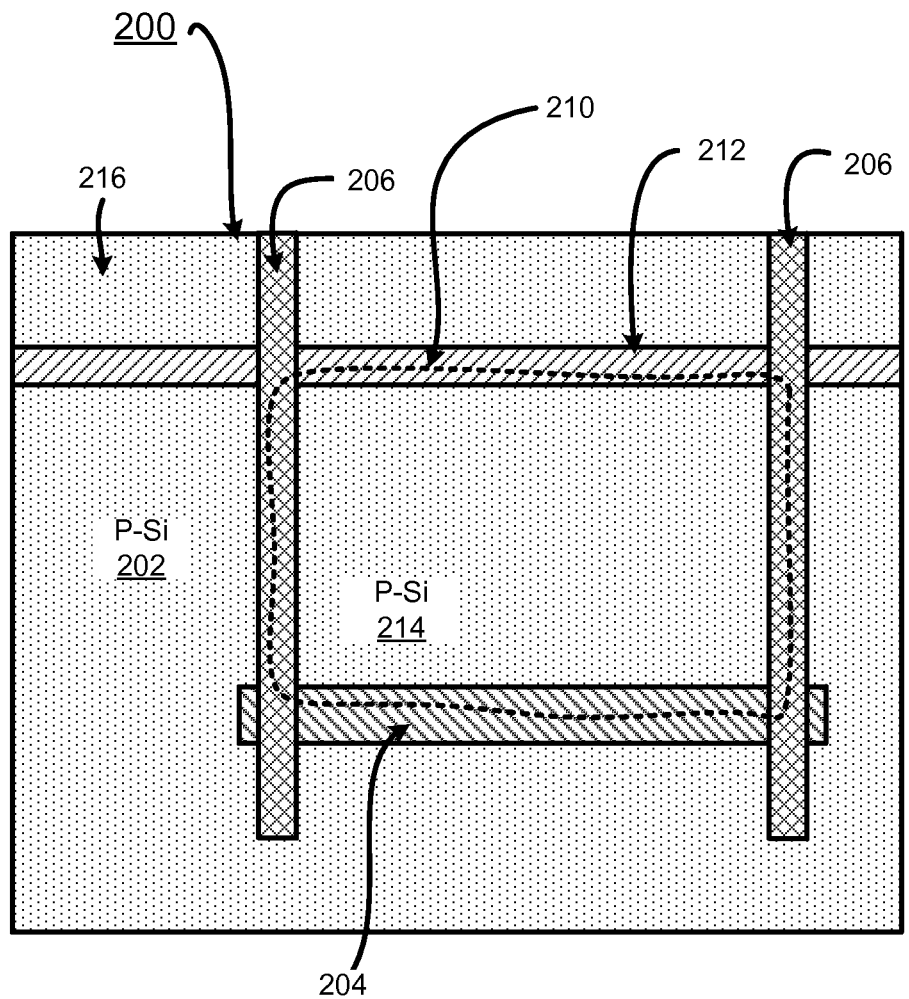
FIGS. 2A, 2B and 2C illustrates example views of exemplary processing steps of an example semiconductor chip of the temporary disable circuit of FIG. 1 in accordance with a preferred embodiment.
Figure 2B:
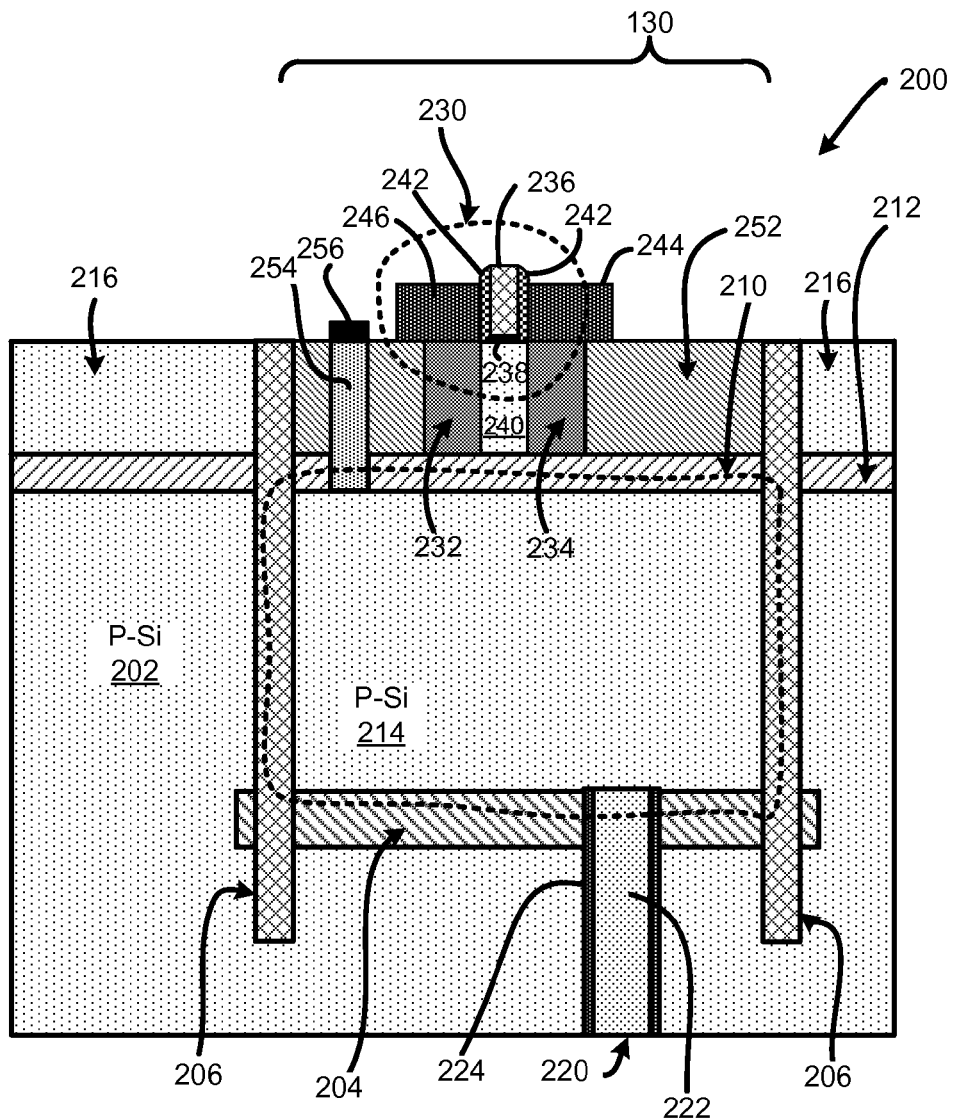
Figure 2C:
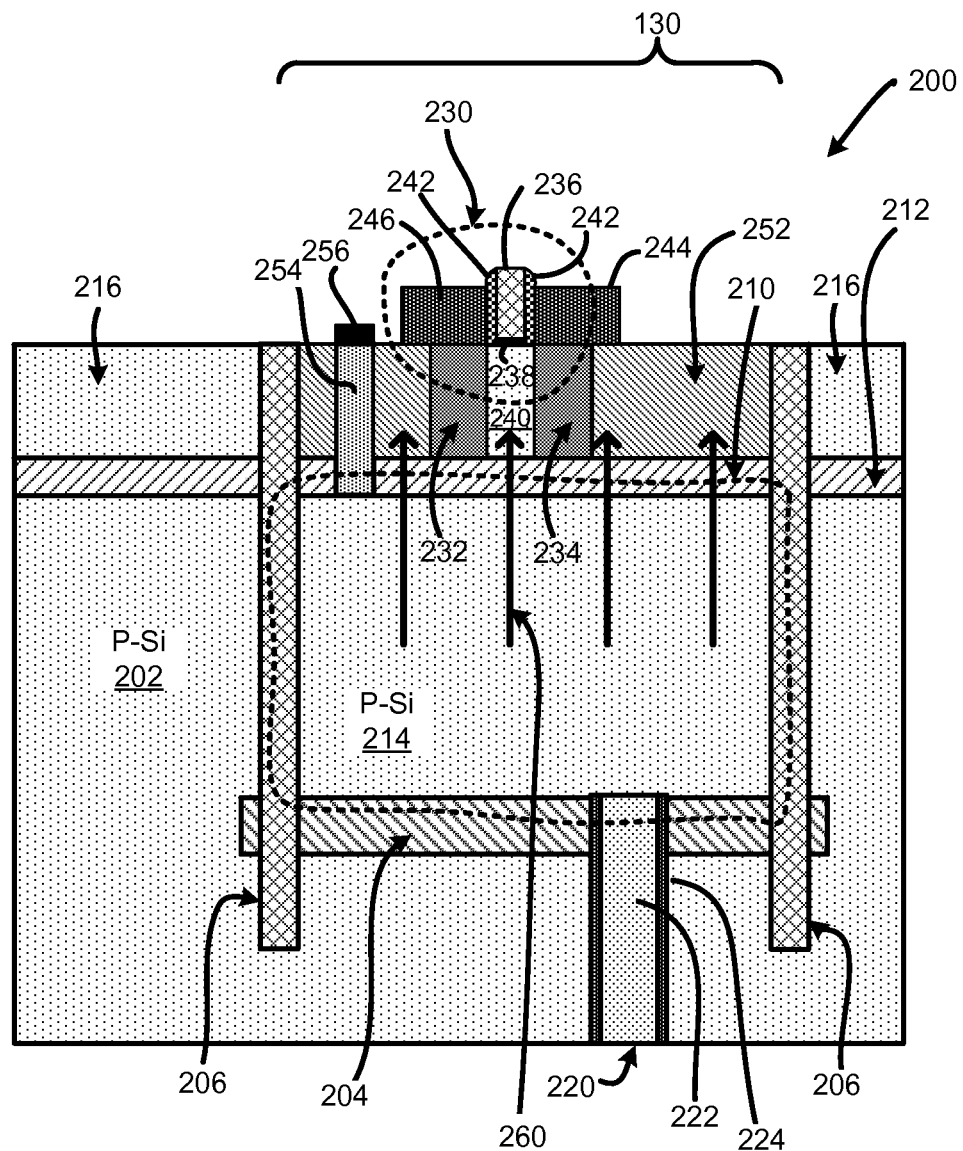

An exemplary semiconductor silicon on insulator (SOI) chip 200 at example processing steps are illustrated and described with respect to FIGS. 2A, 2B, and 2C for implementing the hacking detection and temporary disable circuit 100.

Referring first to FIG. 2A, there is shown the exemplary semiconductor silicon on insulator (SOI) chip 200 for implementing the temporary disable circuit 100 including initial processing steps to create the independently voltage controlled silicon region 210 indicated by dotted line. As shown, the SOI chip has a substrate 202 is typically P– doped silicon, although substrates of opposite (i.e., N–) are also known.

As shown in FIG. 2A, the independently voltage controlled silicon region 210 is an isolated substrate region formed in the chip P—Si substrate 202. The independently voltage controlled silicon region 210 in the SOI chip 200 provides the circuit element 210 modulating threshold voltage shifts of the timing sensitive circuit 130 of circuitry to be protected illustrated in hacking detection and temporary disable circuit 100.

As shown in FIG. 2A, a bottom of the independently voltage controlled silicon region 210 is created with a deep implant 204 such as a boron implant to create a deep N implant with the P—Si substrate 202. The deep implant 204 has opposite doping to a substrate doping of the semiconductor chip 200 including a boron implant to create an N region when the substrate doping of the semiconductor chip is doped P–. The semiconductor chip 100 receives high energy boron implant through a mask (not shown), thereby creating the deep N implant 204 at a depth determined by implant energy and semiconductor structure. For example, a 4 MeV boron implant is provided to create the deep N implant 204 approximately 20 um below a top surface of semiconductor chip 200.

As shown in FIG. 2A, a deep trench isolation 206 extending below the deep N implant 204 forms each side 206 of the independently voltage controlled silicon region 210, thereby insulating the independently voltage controlled silicon region on all sides. The deep trench isolation 206 forms the four sides of the square or rectangular independently voltage controlled silicon region 210. The deep trench isolation 206 may be created using a conventional process such as used to create embedded dynamic random access memory (eDRAM) capacitors, and is elongated to form sides of the independently voltage controlled silicon region 210. A buried oxide (BOX) layer or region 212 forms a top surface of the independently voltage controlled silicon region 210, thereby completing electrical isolation of the independently voltage controlled silicon region. The BOX region 212 is created by a conventional oxygen implant applied to semiconductor chip 200 at a depth determined by energy of the oxygen implant.

Following construction of the deep N implant 204, trench isolation 206, and BOX 212, the P—Si 214 within the independently voltage controlled silicon region 210 is totally isolated electrically. P—Si 214 is merely an electrically isolated portion of P—Si substrate 202 and does not receive a separate implant. The BOX region 212 provides an electric insulator under a P—Si substrate 216 that is an upper electrically isolated portion of P—Si substrate 202.

Referring first to FIG. 2B, there is shown the exemplary semiconductor silicon on insulator (SOI) chip 200 for implementing the temporary disable circuit 100 after further processing steps to create the timing sensitive circuit 130 of circuitry to be protected above the independently voltage controlled silicon region 210.

An electrical contact 220 is formed through the deep N implant 204 and the silicon substrate 202 below the independently voltage controlled silicon region for connecting the independently voltage controlled silicon region 210 to the startup grounding signal and the hack detect charging signal applied by the threshold voltage control function 120 of circuit 100. The electrical contact 220 is a vertical electrical connection (via), such as a through silicon via passing through the P—Si substrate 202 and the deep N implant 204. The electrical contact 220 comprises a conductor 222 and a dielectric material 224. A dielectric material 224 isolates conductor 222 from the P—Si substrate 202. The conductor 222 may be tungsten, doped polysilicon, or other suitable conducting material. Dielectric material 224 may be, for examples HfO2 or SiO2, or other suitable dielectric material.

A single field effect transistor (FET) 230 such as an N-channel or NFET is shown in the area for timing sensitive circuit 130, however it will be appreciated that a large number, for example millions or more, NFETs 230 can be placed in this area. NFET 230 includes a source 232, a drain 234, a gate 236, a gate dielectric 238, a body 240, sidewall spacers 242, and optional epitaxial growths 244 and 246. The optional epitaxial growths 244 and 246 are used to couple the adjacent source 232 and drain 234, to make electrical contact with deep trench embedded dynamic random access memory (eDRAM) for example, when L2 cache in timing sensitive circuit 130 is eDRAM.

As shown, a contacting structure 254 is formed by etching through a STI (shallow trench isolation) 252 and through BOX layer 212 and filled with a conductor such as tungsten or doped polysilicon, for example, to make electrical connection to P—Si 214. Contacting structure 254 may have a contact 256 to connect to a voltage (voltage source or a logic signal). The shallow trench isolation (STI) 252, as shown in the finely crosshatched portions with crosshatching running up and to the left, is formed in silicon 216 that is the portion of P—Si 102 above BOX layer 212. NFET 230 is formed by conventional processes in silicon 216 in a conventional manner.

It should be understood that alternatively an electrical contact for connecting the independently voltage controlled silicon region 210 to the startup grounding signal and the hack detect charging signal can be formed through the BOX layer 212, and through any STI or silicon above the BOX, such as the illustrated contacting structure 254.

In accordance with features of the invention, an electric field from the isolated independently voltage controlled silicon region 210 extends through the buried oxide 212 and affects the timing sensitive circuit 130, causing a temporary failure responsive to multiple detected hacking attempts over a short period of time.

Referring first to FIG. 2C, there is shown the exemplary semiconductor silicon on insulator (SOI) chip 200 following the processing steps of FIG. 2B with an electric field indicated by multiple arrows 260 responsive to the hack detect charging signal. The temporary disable function of circuitry to be protected implemented by the hacking detection and temporary disable circuit 100 results from the electric field 260 modulating device threshold voltage shifts of the timing sensitive circuit 130 of circuitry to be protected.

In accordance with features of the invention, the circuit 100 for implementing a hacking detection and temporary disable function that deters hacking of electronic devices to be protected without rendering those devices unusable while causing the hacker a degree of inconvenience at a relatively indeterminate time.

It should be understood that the scope of the present invention is not limited to the illustrated arrangement of the hacking detection and disable circuit 100. For example, circuit 100 in accordance with the invention can be implemented with a P-channel field effect transistor (PFET) connected to the antenna and the PFET charging the capacitor and an NFET path to ground for discharging the capacitor low with the dynamic bus being quiet, instead of the illustrated NFET 106 discharging the capacitor, and the path to the voltage supply rail VDD. It should be understood that the scope of the present invention is not limited to the illustrated hacking detection function; various other detection arrangements could be used.

Referring to FIG. 3, there are shown a functional flow diagram illustrating example hacking detection and blocking functional operation in accordance with a preferred embodiment. As indicated at a decision block 300, checking for a hack in process, such as boot code alteration, security key reading, electrical ID alteration, boot memory output, or security memory output, is performed. When there is no hack in process, then no action is taken as indicated at a block 302.

When determined that there is a certain hack in process, then as indicated at a block 304 the chip function is limited permanently using conventional destruct mechanisms for the destruction of circuitry to be protected in a semiconductor chip. For example, at block 304 the scan chains are shut off, the clocks killed and/or the targeted function is permanently removed, bricking the chip.

When there may be a hack in process, then as indicated at a block 308 the chip function is temporarily disabled or changed, for example, with slow down of the chip, blue screen of death, killed and/or the targeted function is temporarily removed, such as until reboot. For example, at block 300 the possible hack is identified responsive to the hacking detect signal SENSE of circuit 100. The detected possible hack is counted as indicated at a block 310, for example, using a bank of a set number n of eFUSEs, or other type of non-volatile memory, to tally the number of possible or may be hacks. Every time a possible or may be hack occurs and the protected device is either locked up or blocked function, forcing a reboot, an eFUSE is blown at block 310. Checking whether the maximum count is exceeded is performed as indicated at a decision block 312. Only the maximum count n of lock-up-and-reboots is allowed. After the maximum count is exceeded, the device is permanently disabled or bricked at block 304. For example, this is achieved by checking the n-th eFUSE on boot-up. If that last eFUSE is blown, then the maximum count has been exceeded and boot-up is disabled with device permanently disabled at block 304. Otherwise, the operations continue returning to decision block 300, and checking if there is hack in process.

Figure 4:
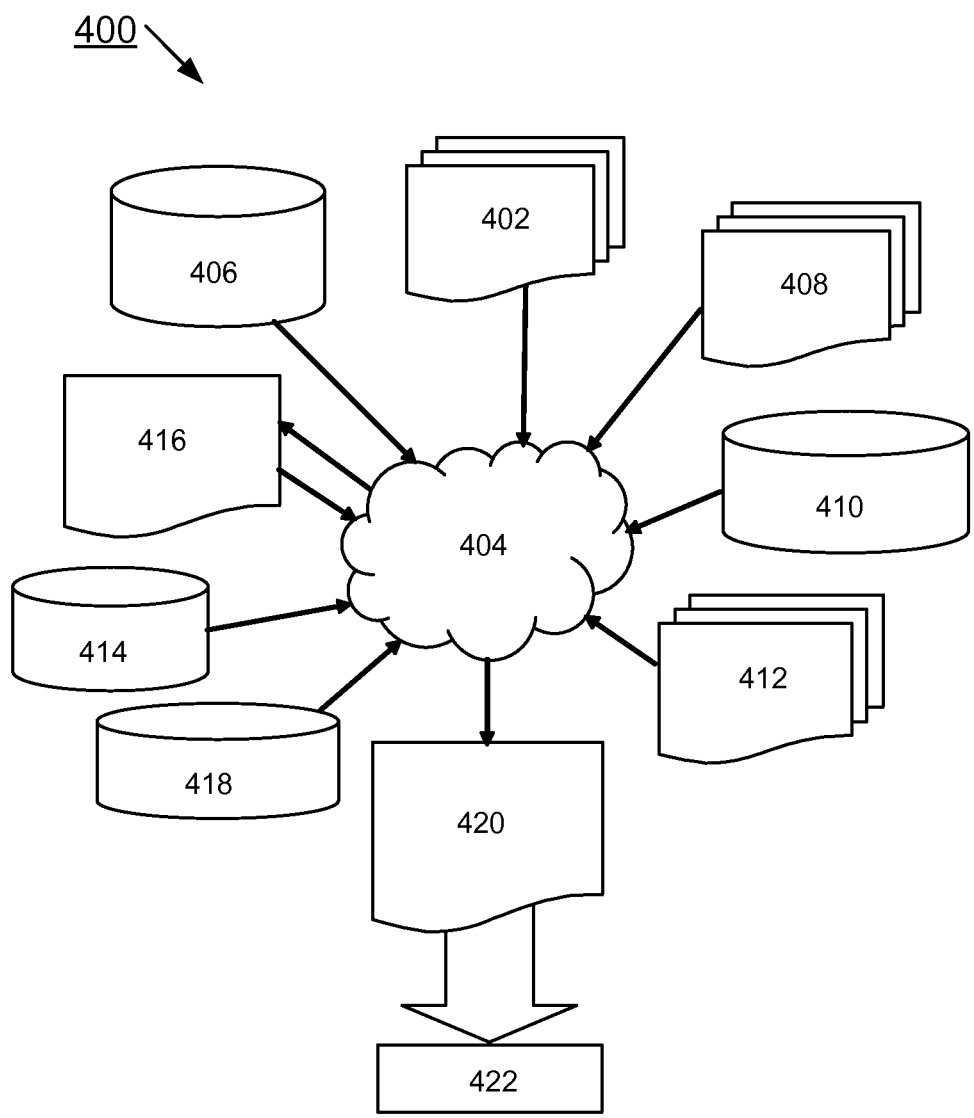
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 100, in the form of schematics or HDL, a hardware-description language, for example, Verilog, VHDL, C, and the like. Design structure 402 may be contained on one or more machine readable medium. For example, design structure 402 may be a text file or a graphical representation of circuit 100. Design process 404 preferably synthesizes, or translates, circuit 100, into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1, 2A, 2B, 2C and 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, 2B, 2C and 3. Design structure 420 may then proceed to a stage 422 where, for example, design structure 420 proceeds to tapeout, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing a temporary disable function of circuitry to be protected of a semiconductor chip comprising:
    a hacking detect function providing a hacking detect signal;
    an independently voltage controlled isolated silicon region;
    a timing sensitive circuit disposed above said independently voltage controlled silicon region;
    a threshold voltage control function receiving said hacking detect signal and applying a charging signal to said independently voltage controlled silicon region for modulating device threshold voltages in said timing sensitive circuit and temporarily disabling said timing sensitive circuit.

2. The circuit as recited in claim 1 wherein said timing sensitive circuit includes a dynamic memory array.

3. The circuit as recited in claim 1 wherein said timing sensitive circuit includes a L2 cache, wherein said circuitry to be protected includes a system on a chip (SOC), and said timing sensitive L2 cache fails and temporarily disables the SOC circuitry to be protected.

4. The circuit as recited in claim 1 wherein said independently voltage controlled silicon region includes an isolated and capacitively-coupled substrate region.

5. The circuit as recited in claim 1 wherein said independently voltage controlled silicon region is created as a circuit element including sides formed with deep trench isolation, insulating the independently voltage controlled silicon region on each side.

6. The circuit as recited in claim 5 wherein said independently voltage controlled silicon region includes a bottom created with a deep implant of opposite doping to a substrate doping of the semiconductor chip.

7. The circuit as recited in claim 5 wherein said independently voltage controlled silicon region includes a buried oxide (BOX) implant forming a top surface of the independently voltage controlled silicon region.

8. The circuit as recited in claim 1 includes a contact structure of electrically conducting material for connecting the independently voltage controlled silicon region to a startup grounding signal and the hacking detect charging signal to the independently voltage controlled silicon region, said electrical contact structure extending through the deep implant and the silicon substrate below the independently voltage controlled silicon region.

9. A design structure embodied in a non-transitory machine readable medium used in a design process, the design structure comprising:
    a circuit tangibly embodied in the non-transitory machine readable medium used in the design process, said circuit for implementing a temporary disable function of circuitry to be protected of a semiconductor chip, said circuit comprising:
    a hacking detect function providing a hacking detect signal;
    an independently voltage controlled isolated silicon region;
    a timing sensitive circuit disposed above said independently voltage controlled silicon region;
    a threshold voltage control function receiving said hacking detect signal and applying a charging signal to said independently voltage controlled silicon region for modulating device threshold voltages in said timing sensitive circuit and temporarily disabling said timing sensitive circuit, wherein the design structure, when read and used in the manufacture of a semiconductor chip produces a chip comprising said circuit.

10. The design structure of claim 9, wherein the design structure comprises a netlist, which describes said circuit.

11. The design structure of claim 9, wherein the design structure resides on storage medium as a data format used for the exchange of layout data of integrated circuits.

12. The design structure of claim 9, wherein the design structure includes at least one of test data files, characterization data, verification data, or design specifications.

13. The design structure of claim 9, wherein said timing sensitive circuit includes a dynamic memory array, wherein said circuitry to be protected includes a system on a chip (SOC), and said timing sensitive dynamic memory array fails and temporarily disables the SOC circuitry to be protected.

14. The design structure of claim 9, includes a contact structure of electrically conducting material for connecting the independently voltage controlled silicon region to a startup grounding signal and the hacking detect charging signal to the independently voltage controlled silicon region, said electrical contact structure extending through the deep implant and the silicon substrate below the independently voltage controlled silicon region.

15. The design structure of claim 9, wherein said independently voltage controlled silicon region includes an isolated and capacitively-coupled substrate region.

16. The design structure of claim 9, wherein said independently voltage controlled silicon region is created as a circuit element including sides formed with deep trench isolation, insulating the independently voltage controlled silicon region on each side.

17. The design structure of claim 16, wherein said independently voltage controlled silicon region includes a bottom created with a deep implant of opposite doping to a substrate doping of the semiconductor chip.

18. The design structure of claim 16, wherein said independently voltage controlled silicon region includes a buried oxide (BOX) implant forming a top surface of the independently voltage controlled silicon region.

19. A method for implementing a temporary disable function of circuitry to be protected of a semiconductor chip comprising:
    providing a hacking detect function for generating a hacking detect signal;
    providing an independently voltage controlled isolated silicon region;
    providing a timing sensitive circuit disposed above said independently voltage controlled silicon region;
    applying said hacking detect signal to a threshold voltage control function; and
    said threshold voltage control function applying a charging signal to said independently voltage controlled silicon region responsive to said hacking detect signal for modulating device threshold voltages in said timing sensitive circuit and temporarily disabling said timing sensitive circuit.

20. The method as recited in claim 19 wherein said timing sensitive circuit includes a dynamic memory array, wherein said circuitry to be protected includes a system on a chip (SOC), and said timing sensitive dynamic memory array fails responsive to said hacking detect signal modulating device threshold voltages in said timing sensitive dynamic memory array and temporarily disables the SOC.

21. The method as recited in claim 19 wherein providing an independently voltage controlled isolated silicon region includes forming sides of said independently voltage controlled silicon region with deep trench isolation, insulating said independently voltage controlled silicon region on each side.

22. The method as recited in claim 21 includes forming a bottom of said independently voltage controlled silicon region with a deep implant of opposite doping to a substrate doping of the semiconductor chip.

23. The method as recited in claim 21 includes forming a top of the independently voltage controlled silicon region with a buried oxide (BOX) implant.

* * * * *